United States Patent
Lin et al.

(10) Patent No.: US 12,532,485 B2
(45) Date of Patent: Jan. 20, 2026

(54) MIM CAPACITOR AND FABRICATING METHOD OF THE SAME

(71) Applicant: UNITED MICROELECTRONICS CORP., Hsin-Chu (TW)

(72) Inventors: Da-Jun Lin, Kaohsiung (TW); Bin-Siang Tsai, Changhua County (TW); Fu-Yu Tsai, Tainan (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 344 days.

(21) Appl. No.: 18/233,899

(22) Filed: Aug. 15, 2023

(65) Prior Publication Data
US 2025/0040158 A1    Jan. 30, 2025

(30) Foreign Application Priority Data

Jul. 24, 2023   (CN) .......................... 202310908666.6

(51) Int. Cl.
*H10D 1/68*   (2025.01)

(52) U.S. Cl.
CPC ............. *H10D 1/684* (2025.01); *H10D 1/692* (2025.01)

(58) Field of Classification Search
CPC ........ H10D 1/682; H10D 1/692; H10D 1/684; H10D 1/696; H10D 1/712; H01L 21/02197; H01L 21/022; H10B 53/00; H10B 12/30
See application file for complete search history.

(56) References Cited

U.S. PATENT DOCUMENTS

| | | | |
|---|---|---|---|
| 5,423,285 A * | 6/1995 | Paz de Araujo ....... | H10D 1/692 438/785 |
| RE38,565 E * | 8/2004 | Hayashi ................. | H10D 1/692 257/295 |
| 8,679,939 B2 | 3/2014 | Malhotra | |
| 2004/0087101 A1* | 5/2004 | Balakumar ............ | H10D 1/684 257/E21.018 |
| 2021/0359100 A1* | 11/2021 | Maeng ................... | H10B 51/00 |

* cited by examiner

*Primary Examiner* — Jose R Diaz
(74) *Attorney, Agent, or Firm* — Winston Hsu

(57) ABSTRACT

A metal-insulator-metal capacitor includes a bottom electrode, a dielectric layer, a superlattice layer, a silicon dioxide layer and a top electrode stacked from bottom to top. The superlattice layer contacts the dielectric layer. A silicon dioxide layer has a negative voltage coefficient of capacitance.

18 Claims, 4 Drawing Sheets

MIM CAPACITOR AND FABRICATING METHOD OF THE SAME

BACKGROUND OF THE INVENTION

1. Field of the Invention

The present invention relates to a metal-insulator-metal (MIM) capacitor, and more particularly to an MIM capacitor utilizing a perovskite superlattice layer as a capacitor dielectric layer.

2. Description of the Prior Art

The charge storage ability of a capacitor depends on a dielectric constant, a distance between two conductive plates, and an area of the conductive plates. In order to reduce product cost by increasing integration, high capacitance density of capacitors is desired for increasing circuit integration. Under the condition that no material with a higher dielectric constant has been found and the distance between the conductive plates can no longer be shortened, the only way to increase the charge storage is to increase the area of the conductive plate. However, today's semiconductor layout requires a high degree of integration, and device sizes are continuously shrinking. Increasing the area of the conductive plate does not meet today's requirements for semiconductor layout. Therefore, how to construct a capacitor structure with high capacitance in a limited area has become an important topic.

SUMMARY OF THE INVENTION

In view of this, the present invention uses a superlattice layer as a capacitor dielectric layer of an MIM capacitor, so as to increase capacitance without increasing the size of the MIM capacitor.

According to a preferred embodiment of the present invention, an MIM capacitor includes a bottom electrode, a dielectric layer, a superlattice layer, a silicon dioxide layer and a top electrode stacked from bottom to top; wherein the superlattice layer contacts the dielectric layer and the silicon dioxide layer, and the silicon dioxide layer has a negative voltage coefficient of capacitance.

According to another preferred embodiment of the present invention, a fabricating method of an MIM capacitor includes forming a bottom electrode, a dielectric layer, a superlattice layer, a silicon dioxide layer and a top electrode stacked from bottom to top; wherein the superlattice layer contacts the dielectric layer and the silicon dioxide layer, and the silicon dioxide layer has a negative voltage coefficient of capacitance.

These and other objectives of the present invention will no doubt become obvious to those of ordinary skill in the art after reading the following detailed description of the preferred embodiment that is illustrated in the various figures and drawings.

DETAILED DESCRIPTION

FIG. 1 to FIG. 7 depict a fabricating method of an MIM capacitor according to a preferred embodiment of the present invention.

Figure 1:
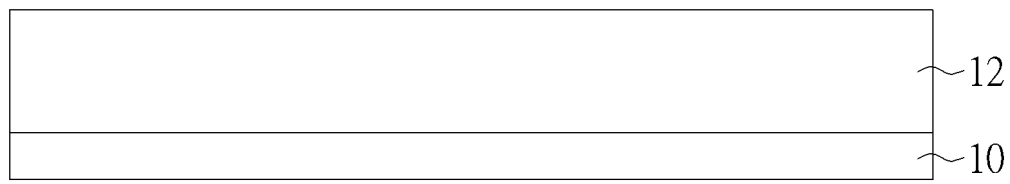
FIG. 1 depicts a substrate with an interlayer dielectric layer thereon.

As shown in FIG. 1, a substrate 10 is provided. At least one transistor (not shown) can be optionally formed on the substrate 10. Next, an interlayer dielectric layer 12 is formed to cover the substrate 10. Metal interconnections (not shown) can be optionally formed in the interlayer dielectric layer 12 to connect the aforementioned transistor.

Figure 2:
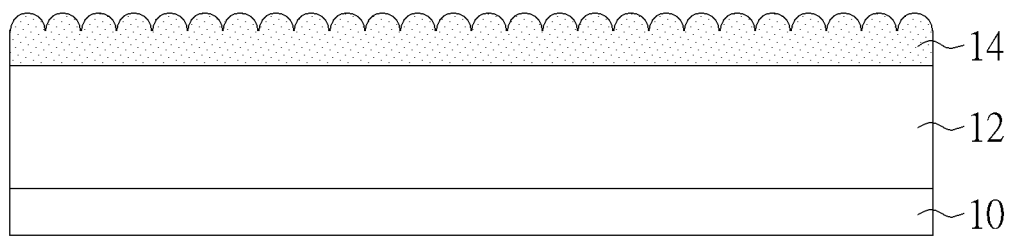
FIG. 2 is a fabricating stage in continuous of FIG. 1.

As shown in FIG. 2, a bottom electrode 14 is formed to cover and contact the interlayer dielectric layer 12. The bottom electrode 14 can be formed by atomic layer deposition, a chemical vapor deposition, a physical vapor deposition or other deposition processes. Because the bottom electrode 14 is composed of columnar grain structures, the bottom electrode 14 has a concave-convex top surface. The bottom electrode 14 includes TiN, Al, Ta, Cu, Ti or Ta.

Figure 3:
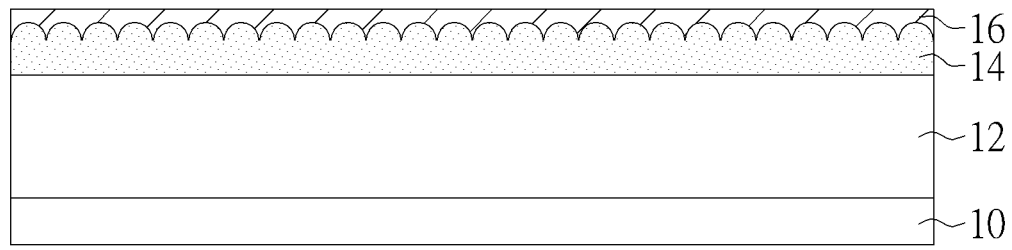
FIG. 3 is a fabricating stage in continuous of FIG. 2.

As shown in FIG. 3, a dielectric layer 16 is formed to cover and contact the bottom electrode 14. The dielectric layer 16 is preferably a nitrogen-containing material with a high energy band gap. For example, the dielectric layer 16 can be $AlN_x$ or $BN_x$. The dielectric layer 16 can be formed by an atomic layer deposition, a chemical vapor deposition, a physical vapor deposition or other deposition processes. Because the bottom electrode 14 has the concave-convex top surface, the dielectric layer 16 can fill in concave positions of the concave-convex top surface. Furthermore, the dielectric layer 16 can provide a flat top surface on the bottom electrode 14. That is, the top surface of the dielectric layer 16 is flat. Therefore, material layers formed subsequently can be stacked on the flat top surface of the dielectric layer 16.

Figure 4:
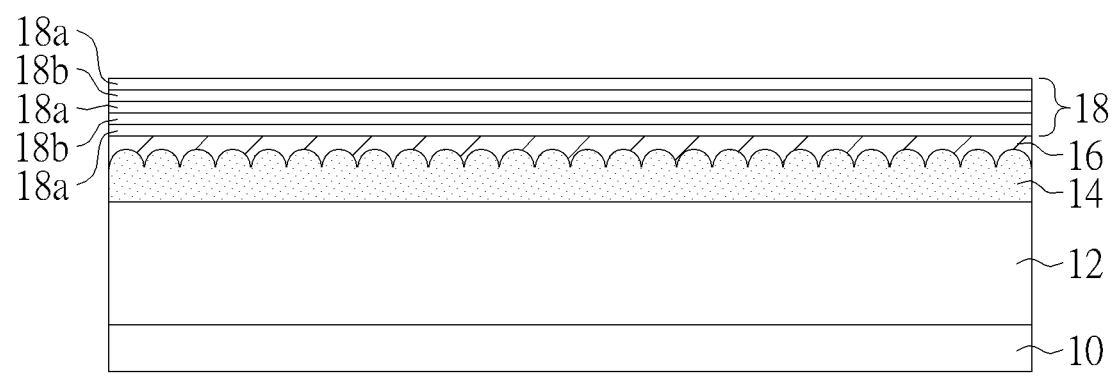
FIG. 4 is a fabricating stage in continuous of FIG. 3.

As shown in FIG. 4, a superlattice layer 18 is formed to contact the dielectric layer 16. In this embodiment, the superlattice layer 18 is formed by stacking periodically and alternately at least two types of perovskite material layers. In different embodiments, more than two types of perovskite material layers can also be used for stacking. The perovskite material layers can be formed by an atomic layer deposition, a chemical vapor deposition, a physical vapor deposition or other deposition processes at an operation temperature between 350 degrees Celsius to 450 degrees Celsius. The perovskite material layers include $SrTiO_x$, $BaTiO_x$, $CaTiO_x$, $CaMgO_x$ or $PbTiO_x$. The superlattice layer 18 includes perovskite material layers not less than five layers. The total number of perovskite material layers of the superlattice layer 18 is preferably between 5 and 20 layers. According to a preferred embodiment of the present invention, the superlattice layer 18 may be formed by periodically and alternately stacking strontium titanium oxide ($SrTiO_x$) 18a/barium titanium oxide ($BaTiO_x$) 18b. The superlattice layer 18 has a positive voltage coefficient of capacitance (VCC).

According to another preferred embodiment of the present invention, the superlattice layer 18 can also be formed by metal doped with titanium oxide. For example, the superlattice layer 18 can be formed by stacking periodically and alternately two different metals respectively doped with titanium oxide or stacking periodically and alternately the same metal doped with different concentrations of titanium oxide.

Figure 5:
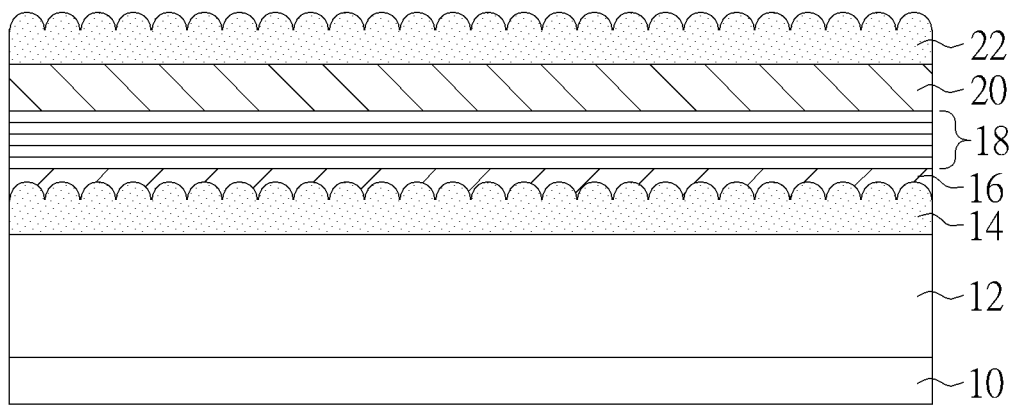
FIG. 5 is a fabricating stage in continuous of FIG. 4.

As shown in FIG. 5, a silicon dioxide layer 20 is formed to cover and contact the superlattice layer 18. It is noteworthy that the silicon dioxide layer 20 has a negative voltage coefficient of capacitance. The silicon dioxide layer 20 is annealed, polarized and amorphous silicon dioxide. According to a preferred embodiment of the present invention, the manufacturing method of the silicon dioxide layer 20 includes forming an amorphous silicon dioxide layer 20 by a physical vapor deposition, a chemical vapor deposition or an atomic layer deposition. Later, an annealing process operated at a temperature of 400 degrees Celsius is performed to the silicon dioxide layer 20 to transform the silicon dioxide layer 20 to become polarized and has a negative voltage coefficient of capacitance. Then, a top electrode 22 is formed to cover and contact the silicon dioxide layer 20. The top electrode 22 is formed by a physical vapor deposition, a chemical vapor deposition, an atomic layer deposition or other deposition processes. Because the top electrode 22 is composed of columnar grain structures, the top electrode 22 has a concave-convex top surface. The top electrode 22 includes TiN, Al, Ta, Cu, Ti or Ta.

Figure 6:
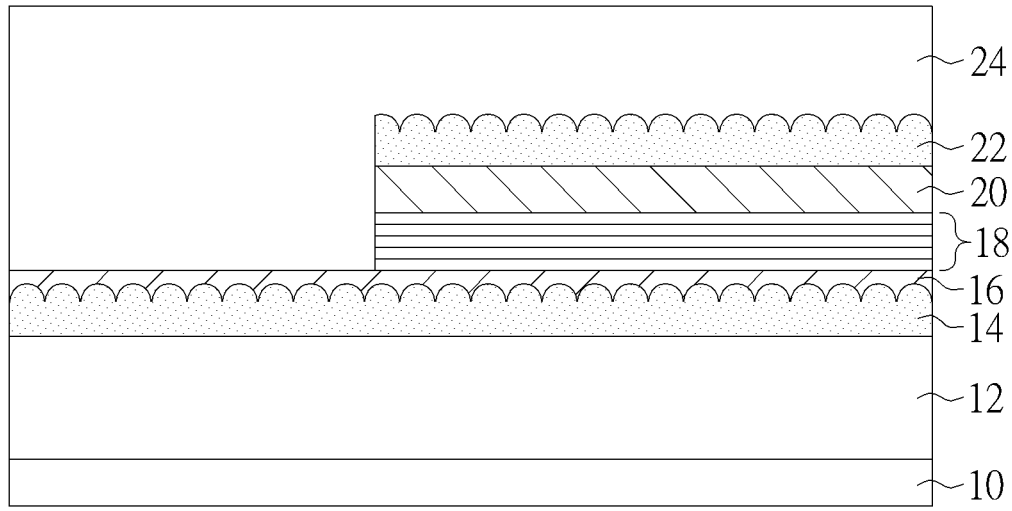
FIG. 6 is a fabricating stage in continuous of FIG. 5.

As shown in FIG. 6, an etching process is performed to remove part of the top electrode 22, part of the silicon dioxide layer 20 and part of the superlattice layer 18 by using the dielectric layer 16 as an etching stop layer. At this time, part of the dielectric layer 16 is exposed. After that, an inter-metal dielectric layer 24 is formed to cover the top electrode 22, the silicon dioxide layer 20, the superlattice layer 18, the dielectric layer 16 and the bottom electrode 14.

Figure 7:
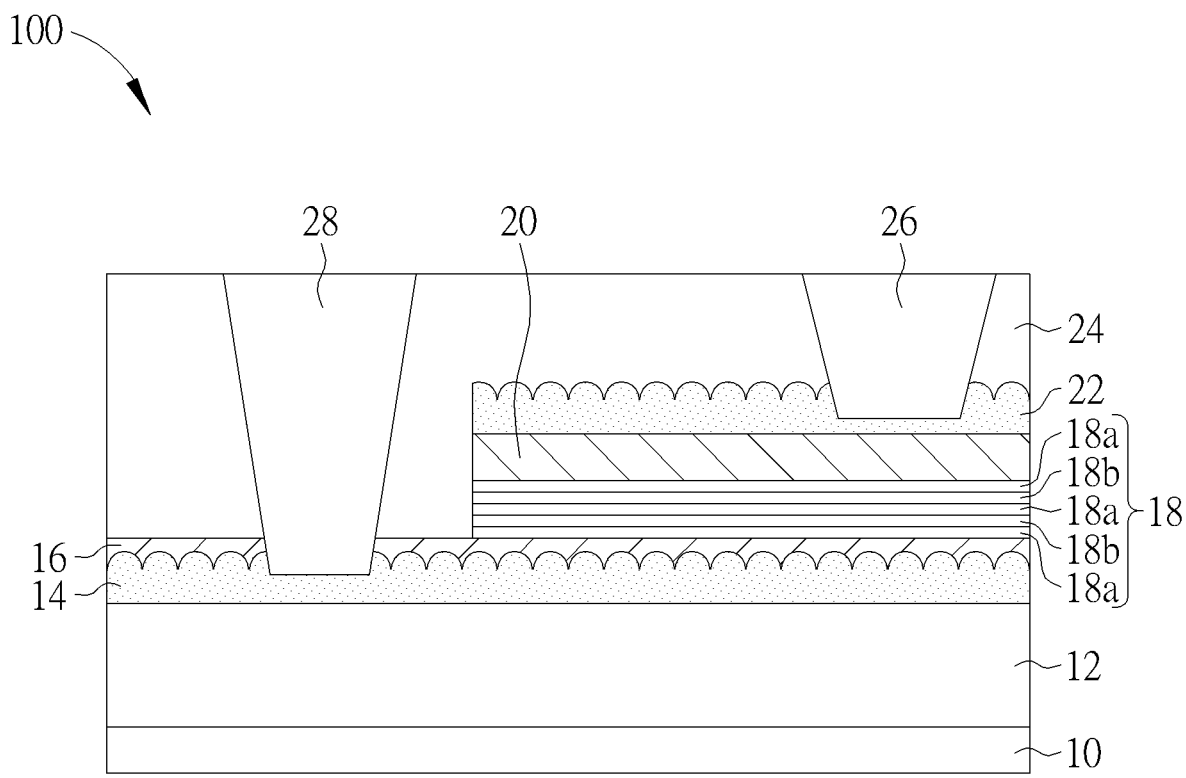
FIG. 7 is a fabricating stage in continuous of FIG. 6.

As shown in FIG. 7, a top electrode contact plug 26 is formed to penetrate the inter-metal dielectric layer 24 to contact the top electrode 22. A bottom electrode contact plug 28 is formed to penetrate the inter-metal dielectric layer 24 and the dielectric layer 16 to contact the bottom electrode 14. Now an MIM capacitor 100 of the present invention 100 is completed.

According to another preferred embodiment of the present invention, An MIM capacitor is provided in the present invention. As shown in FIG. 7, an MIM capacitor 100 is disposed on a substrate 10. An interlayer dielectric layer 12 is disposed on the substrate 10, and the interlayer dielectric layer 12 is sandwiched between the MIM capacitor 100 and the substrate 10. The MIM capacitor 100 includes a bottom electrode 14, a dielectric layer 16, a superlattice layer 18, a silicon dioxide layer 20 and a top electrode 22 stacked from bottom to top. The superlattice layer 18 contacts the dielectric layer 16 and the silicon dioxide layer 20. The silicon dioxide layer 20 has a negative voltage coefficient of capacitance. A top electrode contact plug 26 contacts the top electrode 22, and a bottom electrode contact plug 28 contacts the bottom electrode 14. The top electrode contact plug 26 and the bottom electrode contact plug 28 are located at the same side of the top surface of the substrate 10.

The substrate 10 includes a silicon substrate, a germanium substrate, a gallium arsenide substrate, a silicon germanium substrate, an indium phosphide substrate, a gallium nitride substrate, a silicon carbide substrate or a silicon-on-insulator substrate. The top electrode 22 and the bottom electrode 14 independently include TiN, Al, Ta, Cu, Ti or Ta. The dielectric layer 16 is preferably a nitrogen-containing material with a high energy band gap. For example, the dielectric layer 16 can be $AlN_x$ or $BN_x$. Therefore, the dielectric layer 16 is good at preventing current leakage.

The superlattice layer 18 is formed by stacking periodically and alternately at least two types of perovskite material layers. The superlattice layer 18 includes not less than 5 layers. Advantageously, the total number of perovskite material layers of the superlattice layer 18 is preferably between 5 and 20 layers. Each of the perovskite material layers has a thickness between 10 nm and 60 nm. The total thickness of the superlattice layer 18 is between 100 nm and 2400 nm. The perovskite material layers include $SrTiO_x$, $BaTiO_x$, $CaTiO_x$, $CaMgO_x$ or $PbTiO_x$. The superlattice layer 18 preferably includes perovskite material layers with low crystallinity. The superlattice layer 18 may be formed by periodically and alternately stacking not less than 5 layers of strontium titanium oxide 18a/barium titanium oxide 18b. Moreover, the silicon dioxide layer 20 is annealed, polarized and amorphous silicon dioxide.

Because the perovskite material layer has a high dielectric constant, the present invention uses the perovskite material layer as a part of the capacitor dielectric layer. However, the energy band gap of the perovskite material layer is small, so current leakage occurs easily through the perovskite material layer. Furthermore, the voltage coefficient of capacitance of the perovskite material layer is positive, so charge/discharge performance of the perovskite material layer at low voltage and high voltage is nonlinear. Therefore, in the present invention, a nitrogen-containing material with a high energy band gap is disposed under the superlattice layer formed by the perovskite material layer to prevent current leakage of the perovskite material layer. In addition, a silicon dioxide layer with a negative voltage coefficient of capacitance is disposed above the superlattice layer formed by the perovskite material layer to balance the positive voltage coefficient of capacitance. In this way, the MIM capacitor of the present invention has the advantage of a high dielectric constant provided by the perovskite material layer, and the current leakage and nonlinear charge/discharge performance can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal-insulator-metal (MIM) capacitor, comprising:
a bottom electrode, a dielectric layer, a superlattice layer, a silicon dioxide layer and a top electrode stacked from bottom to top; wherein the superlattice layer contacts the dielectric layer and the silicon dioxide layer, and the silicon dioxide layer has a negative voltage coefficient of capacitance, and wherein the dielectric layer comprises $AlN_x$ or $BN_x$.

2. The MIM capacitor of claim 1, wherein the silicon dioxide layer is annealed and polarized silicon dioxide.

3. The MIM capacitor of claim 1, wherein the silicon dioxide layer is amorphous silicon dioxide.

4. The MIM capacitor of claim 1, wherein the superlattice layer comprises perovskite material layers not less than 5 layers.

5. The MIM capacitor of claim 1, wherein the superlattice layer comprises perovskite material layers not less than 5 layers, and a thickness of each of the perovskite material layers is between 10 nm and 60 nm.

6. The MIM capacitor of claim 1, wherein the superlattice layer comprises $SrTiO_x$, $BaTiO_x$, $CaTiO_x$, $CaMgO_x$ or $PbTiO_x$.

7. The MIM capacitor of claim 1, wherein the superlattice layer has a positive voltage coefficient of capacitance.

8. The MIM capacitor of claim 1, wherein the top electrode comprises TiN, Al, Ta, Cu, Ti or Ta, and the bottom electrode comprises TiN, Al, Ta, Cu, Ti or Ta.

9. The MIM capacitor of claim 1, wherein the top electrode contacts the silicon dioxide layer, and the bottom electrode contacts the dielectric layer.

10. A fabricating method of a metal-insulator-metal (MIM) capacitor, comprising:
forming a bottom electrode, a dielectric layer, a superlattice layer, a silicon dioxide layer and a top electrode stacked from bottom to top; wherein the superlattice layer contacts the dielectric layer and the silicon dioxide layer, and the silicon dioxide layer has a negative voltage coefficient of capacitance, and wherein the dielectric layer comprises $AlN_x$ or $BN_x$.

11. The fabricating method of an MIM capacitor of claim 10, wherein steps of fabricating the superlattice layer comprise using a deposition process, periodically and alternately stacking a perovskite material layer at an operation temperature between 350 degrees Celsius to 450 degrees Celsius.

12. The fabricating method of an MIM capacitor of claim 11, wherein the deposition process comprises an atomic layer deposition, a chemical vapor deposition or a physical vapor deposition.

13. The fabricating method of an MIM capacitor of claim 10, wherein steps of fabricating the silicon dioxide layer comprise:
depositing the silicon dioxide layer; and
performing an annealing process to the silicon dioxide layer at a temperature of 400 degrees Celsius.

14. The fabricating method of an MIM capacitor of claim 10, wherein the silicon dioxide layer is amorphous and polarized silicon dioxide.

15. The fabricating method of an MIM capacitor of claim 10, wherein the superlattice layer comprises perovskite material layers not less than 5 layers.

16. The fabricating method of an MIM capacitor of claim 10, wherein the superlattice layer comprises perovskite material layers not less than 5 layers, and a thickness of each of the perovskite material layers is between 10 nm and 60 nm.

17. The fabricating method of an MIM capacitor of claim 10, wherein the superlattice layer comprises $SrTiO_x$, $BaTiO_x$, $CaTiO_x$, $CaMgO_x$ or $PbTiO_x$.

18. The fabricating method of an MIM capacitor of claim 10, wherein the superlattice layer has a positive voltage coefficient of capacitance.

* * * * *